United States Patent [19]
Skrovan et al.

[11] Patent Number: 5,960,457
[45] Date of Patent: Sep. 28, 1999

[54] CACHE COHERENCY TEST SYSTEM AND METHODOLOGY FOR TESTING CACHE OPERATION IN THE PRESENCE OF AN EXTERNAL SNOOP

[75] Inventors: Joseph Skrovan, Buda; Royce K. Presley, Kyle; Hamilton B. Carter, Austin, all of Tex.

[73] Assignee: Advanced Micro Devices, Inc., Sunnyvale, Calif.

[21] Appl. No.: 08/846,651

[22] Filed: May 1, 1997

[51] Int. Cl.$^6$ ..................................................... G06F 12/00
[52] U.S. Cl. .......................... 711/146; 711/141; 714/32; 714/33
[58] Field of Search ..................................... 711/146, 142, 711/143, 141, 144, 145; 395/183.18, 425, 550, 182.03, 575, 183.05; 364/580; 714/33, 42, 32, 37, 708

[56] References Cited

U.S. PATENT DOCUMENTS

| | | |
|---|---|---|
| 5,155,824 | 10/1992 | Edenfield et al. . |
| 5,195,089 | 3/1993 | Sindhu et al. . |
| 5,197,144 | 3/1993 | Edenfield et al. . |
| 5,226,144 | 7/1993 | Moriwaki et al. . |
| 5,317,720 | 5/1994 | Stamm et al. . |
| 5,325,504 | 6/1994 | Tipley et al. . |
| 5,341,487 | 8/1994 | Derwin et al. ........................ 395/425 |

(List continued on next page.)

FOREIGN PATENT DOCUMENTS 0 397 995 A2  11/1990  European Pat. Off. .

OTHER PUBLICATIONS

Patent Abstracts of Japan, Publication No. JP5282208, Publication Date Oct. 29, 1993, Application No. JP920081233, Application Date Apr. 3, 1992.

Edenfield, R. et al., "The 68040 On–Chip Memory Subsystem," Institute of Electrical and Electronics Engineers, Feb. 1990, Computer Society International Conference (COMPCON), Spring Meeting, Los Alamitos, No. Conf. 25, pp. 264–269.

(List continued on next page.)

*Primary Examiner*—Eddie P. Chan
*Assistant Examiner*—Kimberly Nicole McLean
*Attorney, Agent, or Firm*—Conley, Rose & Tayon, PC; B. Noel Kivlin

[57] ABSTRACT

A test methodology for a cache memory subsystem includes setting a test unit to initiate a snoop cycle on a local bus upon lapse of a predetermined delay. The predetermined delay is initially set to a very short delay or a zero delay. The snoop cycle to be executed may take the form of an inquire cycle to a predetermined memory address. The test unit is further set or programmed to begin monitoring the local bus for certain activity including activity which is indicative of whether the snoop cycle occurred. After programming the test unit, the processor core executes a memory operation associated with the address of the snoop cycle. This memory operation causes a cache line transition. At some point, either before, during or after effectuation of the memory operation, the snoop cycle is executed by the test unit in accordance with the predetermined delay. Upon completing the memory operation, a status register is read from the test unit to determine whether the snoop cycle has yet occurred. If the snoop cycle occurred prior to completing the memory operation, the predetermined delay is increased and the test is repeated for the increased delay. Prior to repeating the test, the cache line's coherency with external memory is checked for conformance with the cache protocol. Additionally, the test unit may further be programmed to detect an occurrence of certain external local bus signals generated by the cache memory subsystem, such as a signal indicating a hit to a cache line occurred, and a signal indicating that a hit to a modified line in the cache occurred. The test is repeated until it is determined that the snoop cycle has not occurred upon completion of the line fill instruction.

12 Claims, 5 Drawing Sheets

U.S. PATENT DOCUMENTS

| | | |
|---|---|---|
| 5,353,423 | 10/1994 | Hamid et al. . |
| 5,355,467 | 10/1994 | MacWilliams et al. . |
| 5,355,471 | 10/1994 | Weight .................................... 395/575 |
| 5,359,723 | 10/1994 | Mathews et al. . |
| 5,406,504 | 4/1995 | Denisco et al. ......................... 364/580 |
| 5,426,765 | 6/1995 | Stevens et al. . |
| 5,428,761 | 6/1995 | Herlihy et al. . |
| 5,740,353 | 4/1998 | Kreulen et al. .................... 395/183.18 |
| 5,748,879 | 5/1998 | Kobayashi ......................... 395/183.19 |
| 5,793,941 | 12/1995 | Pencis et al. ...................... 395/182.03 |

OTHER PUBLICATIONS

Atkins, M., "Performance and the I860 Microprocessor," IEEE Micro, Oct. 1, 1991, vol. 11, No. 5, pp. 24–27, 72–78.

Handy, Jim, "The Cache Memory Book," Academic Press, Inc., San Diego, CA, 1993, pp. 158–190.

European Search Report for EP 95 30 3214.1 dated Aug. 24, 1995.

Hennessy & Patterson, Computer Architecture A Quantitative Approach, 1990 by Morgan Kaufmann Publishers, Inc., pp. 467–474.

| Type | | Cache State Before Access | Access Type | Cache State After Access | |
|---|---|---|---|---|---|
| | | | | MESI State | Writeback Writethrough State |
| Cache Read | Read Miss | invalid | single read | invalid | invalid |
| | | invalid (cacheable) | burst read (line fill) | shared or exclusive | writethrough or writeback |
| | Read Hit | shared | — | shared | writethrough |
| | | exclusive | — | exclusive | writeback |
| | | modified | — | modified | writeback |
| Cache Write | Write Miss | invalid | single write | invalid | invalid |
| | Write Hit | shared | cache update and single write | shared or exclusive | writethrough or writeback |
| | | exclusive or modified | cache update | modified | writeback |

FIG. 1

| Type of Operation | Cache State Before Operation | Memory Access | Cache State After Access | | |
|---|---|---|---|---|---|
| | | | MESI State | | Writeback-Writethrough State |
| Inquire Cycle | shared or exclusive | — | INV=0 | shared | writethrough |
| | | | INV=1 | invalid | invalid |
| | modified | burst write (writeback) | INV=0 | shared | writethrough |
| | | | INV=1 | invalid | invalid |
| Internal Snoop | shared or exclusive | — | invalid | | invalid |
| | modified | burst write (writeback) | | | |
| FLUSH Signal | shared or exclusive | — | invalid | | invalid |
| | modified | burst write (writeback) | | | |
| WBINVD Instruction | shared or exclusive | — | invalid | | invalid |
| | modified | burst write (writeback) | | | |
| INVD Instruction | — | — | invalid | | invalid |
| Cache-Line Replacement | shared or exclusive | — | Depends on replacement-line characteristics | | |
| | modified | burst write (writeback) | | | |

FIG. 2

CACHE COHERENCY TEST SYSTEM AND METHODOLOGY FOR TESTING CACHE OPERATION IN THE PRESENCE OF AN EXTERNAL SNOOP

BACKGROUND OF THE INVENTION

1. Field of the Invention

This invention relates to the testing of microprocessors and cache memory subsystems and more particularly to techniques for testing processor cache coherency in the presence of external snoops.

2. Description of the Relevant Art

Cache-based computer architectures are typically associated with specialized bus transfer mechanisms to support efficient utilization of the cache memory and to maintain data coherency. A cache memory is a high-speed memory unit interposed in the memory hierarchy of a computer system between a slower system memory and a processor core to improve effective memory transfer rates and accordingly improve system performance. The name refers to the fact that the small cache memory unit is essentially hidden and appears transparent to the user, who is aware only of a larger system memory. The cache is usually implemented by semiconductor memory devices having speeds that are comparable to the speed of the processor, while the system memory utilizes a less costly, lower-speed technology. The cache concept anticipates the likely reuse by the microprocessor of selected data in system memory by storing a copy of the selected data in the cache memory.

A cache memory typically includes a plurality of memory sections, wherein each memory section stores a block or a "line" of two or more words of data. For systems based on the particularly popular model 80486 microprocessor, a line consists of four "doublewords" (wherein each doubleword comprises four 8-bit bytes). Similarly, in the equally popular AMD$_K$86™ processor, a line consists of eight doublewords. Each line has associated with it an address tag that uniquely identifies which line of system memory it is a copy of. When a read request originates in the processor for a new word (or a new doubleword or a new byte), whether it be data or instruction, an address tag comparison is made to determine whether a copy of the requested word resides in a line of the cache memory. If present, the data is used directly from the cache. This event is referred to as a cache read "hit". If not present, a line containing the requested word is retrieved from system memory and stored in the cache memory. The requested word is simultaneously supplied to the processor. This event is referred to as a cache read "miss".

One aspect that affects system performance and design complexity is the handling of writes initiated by the processor or by an alternate bus master. Because two copies of a particular piece of data or instruction code can exist, one in system memory and a duplicate copy in the cache, writes to either the system memory or the cache memory by the processor or an alternate bus master can result in an incoherence between the two storage units. Thus, a cache coherency protocol is typically implemented by the system in order to maintain cache coherence.

One popular cache coherence protocol is referred to as the "MESI" protocol. A line in a cache subsystem implementing the MESI protocol may acquire one of four states: Modified, Exclusive, Shared, or Invalid. FIG. 1 is a table that illustrates possible cache line state transitions due to processor read and write operations in an exemplary processor implementing the MESI protocol. The table further illustrates whether a writethrough or writeback operation is effectuated. FIG. 2 is a table that illustrates possible cache line transitions due to snoop, invalidation, and replacement cycles.

The test of a microprocessor's functionality is essential in determining whether a particular processor has any design or manufacturing defects. While upon first consideration the test of the coherency operations of a cache subsystem in a microprocessor might appear to be simple confirmation of the states of a particular cache line before and after a particular cache access, complicated timing analysis may actually be required due to the various stages of buffering in a pipelined processor through which a particular operation must progress. A defect at any point in the cache subsystem pipeline stages can cause a fatal and difficult-to-detect error in the system. Particularly, since an external snoop may occur at any point during the effectuation of a memory operation associated with the cache memory, a separate test must be performed to determine proper cache operation for each possible stage through which the operation may have progressed at the point when the external snoop occurs. Such tests are highly dependent upon the timing, the routing, and the pipelining associated with the specific processor and cache subsystem being tested.

A particular problem occurs when a processor design is revised, such as when modifications are made to a processor to allow higher frequencies of operation. Frequently, when the processor is modified the timing associated with cache memory operations may be changed, for example, through the addition or deletion of various pipeline stages or through a change in the ratio of the internal to external clock frequencies. When such modifications are made, the test routines created for the previous version of the processor may become invalid or, perhaps even worse, may omit essential tests upon certain aspects of the subsystem. As a result, processor malfunctions may go undetected, and substantial time and effort must be devoted to creating new test routines for the revised processor.

It would accordingly be desirable to provide a cache coherency test apparatus and methodology for testing cache coherency in the presence of external snoops wherein timing and architectural dependencies associated with the test routines may be reduced.

SUMMARY OF THE INVENTION

The problems outlined above are in large part solved by a cache coherency test apparatus and methodology for testing cache subsystem functionality in the presence of external snoop operations in accordance with the present invention. In one embodiment, a cache memory subsystem is coupled between a processor core and a local bus. The cache memory subsystem includes a cache memory coupled to an associated cache controller. The cache memory subsystem may further include a plurality of pipeline stages with associated buffers which provide an interface for input and output information corresponding to memory operations associated with the cache memory. The test methodology includes setting a test unit to initiate a snoop cycle on a local bus upon lapse of a predetermined delay. The predetermined delay is initially set to a very short delay or a zero delay. The snoop cycle to be executed may take the form of an inquire cycle to a predetermined memory address. The test unit is further set or programmed to begin monitoring the local bus for certain activity including activity which is indicative of whether the snoop cycle occurred. After programming the test unit, the processor core executes a memory operation that may correspond to an address associated with the address of the snoop. This memory operation causes a cache line transition. At some point, either before, during or after effectuation of the memory operation, the snoop cycle is executed by the test unit in accordance with the predetermined delay. Upon completing the memory operation, a status register is read from the test unit to determine whether the snoop cycle has yet occurred. If the snoop cycle occurred prior to completing the memory operation, the predetermined delay is increased and the test is repeated for the increased delay. Prior to repeating the test, the coherency of the cache and external memory is tested. If the snoop cycle occurred after completing the memory operation, the test is exited and is considered as passing. In one implementation, the value stored within the address corresponding to the cache line address in system memory is read by the test unit in accordance with previous programming information. In this manner, the state of the cache line in the cache memory subsystem is not affected. Additionally, the test unit may further be programmed to detect an occurrence of certain external local bus signals generated by the cache memory subsystem, such as a signal indicating a hit to a cache line occurred, and a signal indicating that a hit to a modified line in the cache occurred. Before reinitiating the test with an increased delay, the state of the cache line associated with the memory and snoop operations of the test may be invalidated.

After each iteration, the results of the cache operation may be evaluated and compared to the expected results in accordance with the coherency model. The test is repeated until it is determined that the snoop cycle has not occurred. By providing appropriate increments in the delay, the cache operation may thus be tested for each possible progression of a memory operation as it propagates through the processor pipeline with respect to occurrences of external snoops. Furthermore, the test operation is automatically completed upon detecting that the snoop operation has not yet occurred upon completion of the line fill operation. Excessive test operations may thereby be avoided.

The cache coherency test system and methodology of the present invention for testing cache operation in the presence of an external snoop may advantageously accommodate exhaustive and efficient cache operation tests. Importantly, the test routines may not be required to be changed even if modifications in the pipelining or routing of the cache memory subsystem are made.

BRIEF DESCRIPTION OF THE DRAWINGS

Other objects and advantages of the invention will become apparent upon reading the following detailed description and upon reference to the accompanying drawings in which:

FIG. 1 is a table that illustrates possible cache line state transitions due to processor read and write operations in an exemplary processor.

FIG. 2 is a table that illustrates possible cache line transitions due to snoop, invalidation, and replacement cycles.

Figure 3:
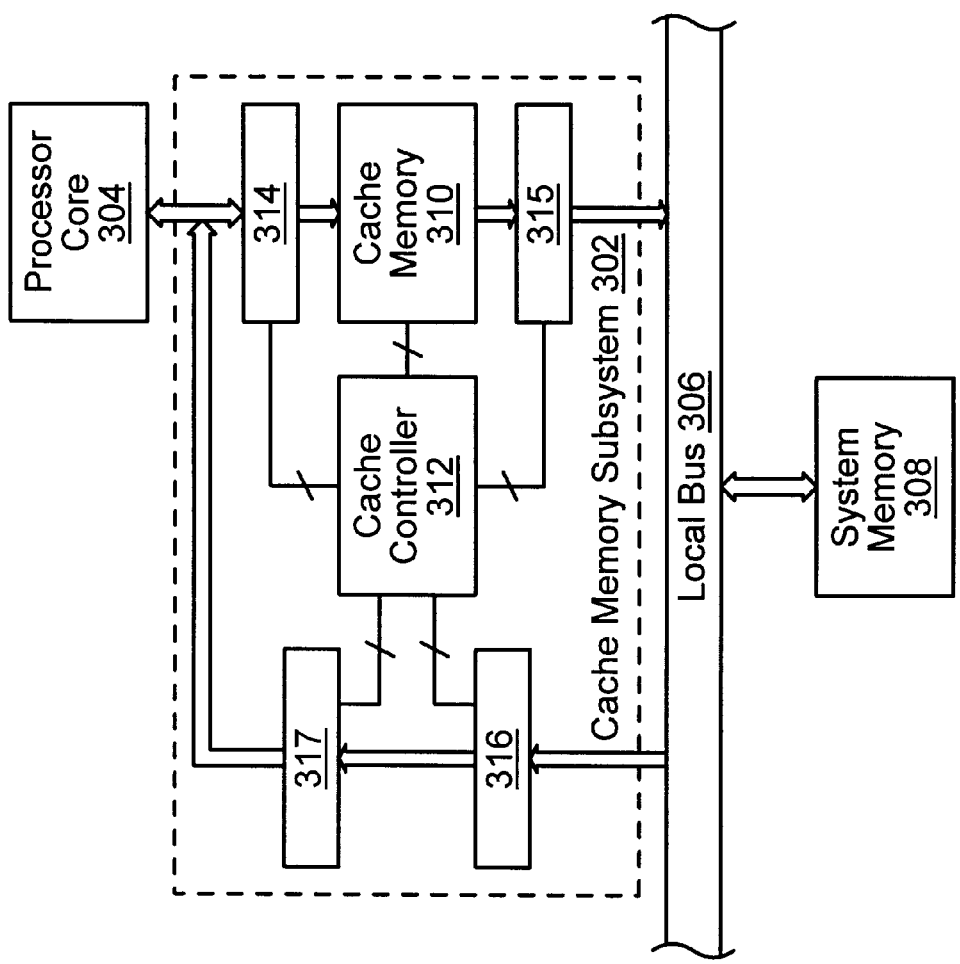
FIG. 3 is a block diagram of a system including a cache memory subsystem.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning next to FIG. 3, a block diagram is shown of a system including a cache memory subsystem 302 coupled between a processor core 304 and a local bus 306. A system memory 308 is further shown coupled to local bus 306. Cache memory subsystem 302 includes a cache memory 310 which may be implemented in SRAM, an associated cache controller 312, and a plurality of pipeline stages illustratively represented by buffering stages 314–317. It is noted that additional features of cache memory subsystem 302 not pertinent to the understanding of the present invention are not shown in this illustration for simplicity and clarity.

Buffering stages 314–317 are employed to convey information relating to memory operations being operated upon by cache memory subsystem 302 in a pipelined fashion. Various operations may be performed within each stage as a memory operation progresses through the pipeline. For example, tag comparison operations may be performed when a particular memory operation resides in buffering stage 314, and bus arbitration operations may be conducted when the memory operation resides in buffering stage 315. Similarly, parity checking and line formation operations, among others, may be performed during stages 316 and 317. The form of information residing in a particular buffering stage 314–317 may vary from stage to stage and may depend upon the particular memory operation being effectuated. For example, during a memory read operation, address and control information associated therewith may be stored within buffering stage 315. Several clock cycles later in accordance with the pipeline progression, data information corresponding to the operation may be conveyed from system memory 308 to buffering stage 316.

While coherency protocols are defined at the system level, and are typically dictated by the order in which operations are presented upon an external bus, testing of a cache memory subsystem such as that illustrated can typically require precise timing for associated test routines to ensure that the coherency functionality of the subsystem is operating correctly for each possible progression of a particular operation in the pipeline. Consider for example a situation wherein processor core 304 initiates a memory read operation. The processor core 304 may present the address and control information associated with the read operation to cache memory subsystem 302, which initially stores the information into buffering stage 313. At this point, a cache look-up may be performed to determine if the requested data already resides in the cache memory 310. If the data is not present, the cache memory subsystem 302 advances the pipeline such that the address and control information are stored within buffer 315. An appropriate read cycle is then effectuated upon local bus 306 to cause the requested data to be read from system memory 308. Upon subsequent cycles, data information is stored within buffer stages 316 and 317 until the data is finally provided to processor core 304 and stored within an allocated line of cache memory 310. Similar operations may occur for write cycles.

Figure 4:
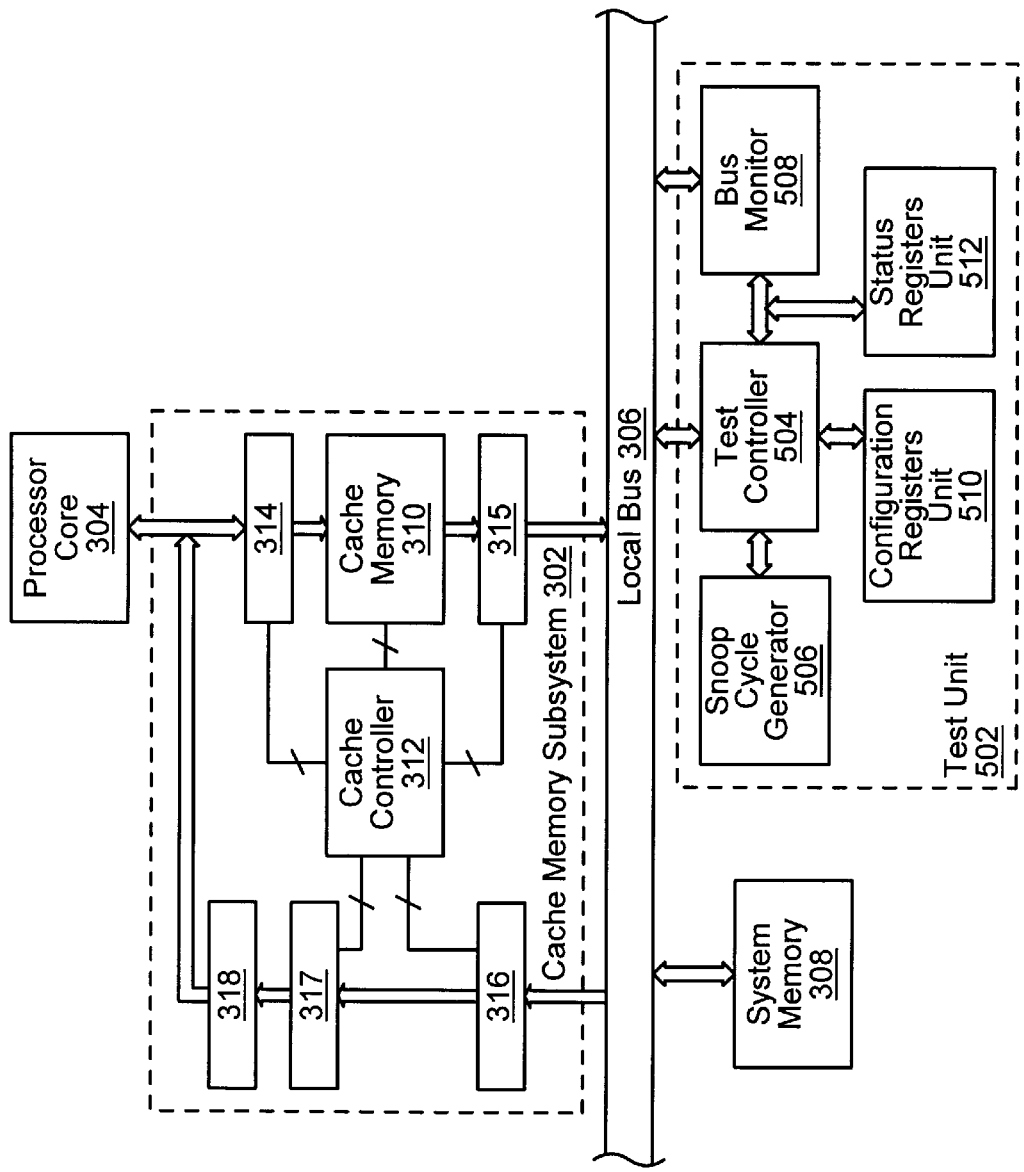
FIG. 4 is a block diagram illustrating certain modifications to the cache memory subsystem of FIG. 3, and further illustrating a test unit.

The coherency state for a particular line in accordance with the coherency protocol implemented by the system may need to change at a given point in the pipeline, and coherency must be always maintained. As stated previously, while separate, timing specific tests may be written to test proper operation of the coherency protocol of the cache memory subsystem as a memory operation propagates from one pipeline stage to another, such tests may become invalid or may inadequately test the cache memory subsystem if pipeline stages are added, the routing of particular operations are modified, or if other timing parameters are changed. For example, if an additional buffering stage 318 as illustrated in FIG. 4 is inserted into the pipelined structure of the cache memory, the overall tests for the cache memory subsystem 302 must typically be rewritten. Such a requirement can be both time consuming and error prone.

Accordingly, to avoid a necessity of having to rewrite the test routines when changes in the internal architecture of a cache memory subsystem are made, a test system and methodology for testing cache coherency in the presence of snoop operations in accordance with the present invention may be employed to test the cache memory subsystem 302, whether it takes the form of FIG. 3 or that of FIG. 4. Specific details regarding one embodiment of the test system and methodology are described next.

As illustrated, in addition to cache memory subsystem 302, processor core 304 and system memory 308, the system of FIG. 4 includes a test unit 502 coupled to local bus 306. Test unit 502 includes a test controller 504 coupled to a snoop cycle generator 506, a bus monitor 508, a configuration registers unit 510 and a status registers unit 512. The operation of the various functional blocks of test unit 502 as they relate to this embodiment of the present invention will be explained in greater detail below.

Figure 5:
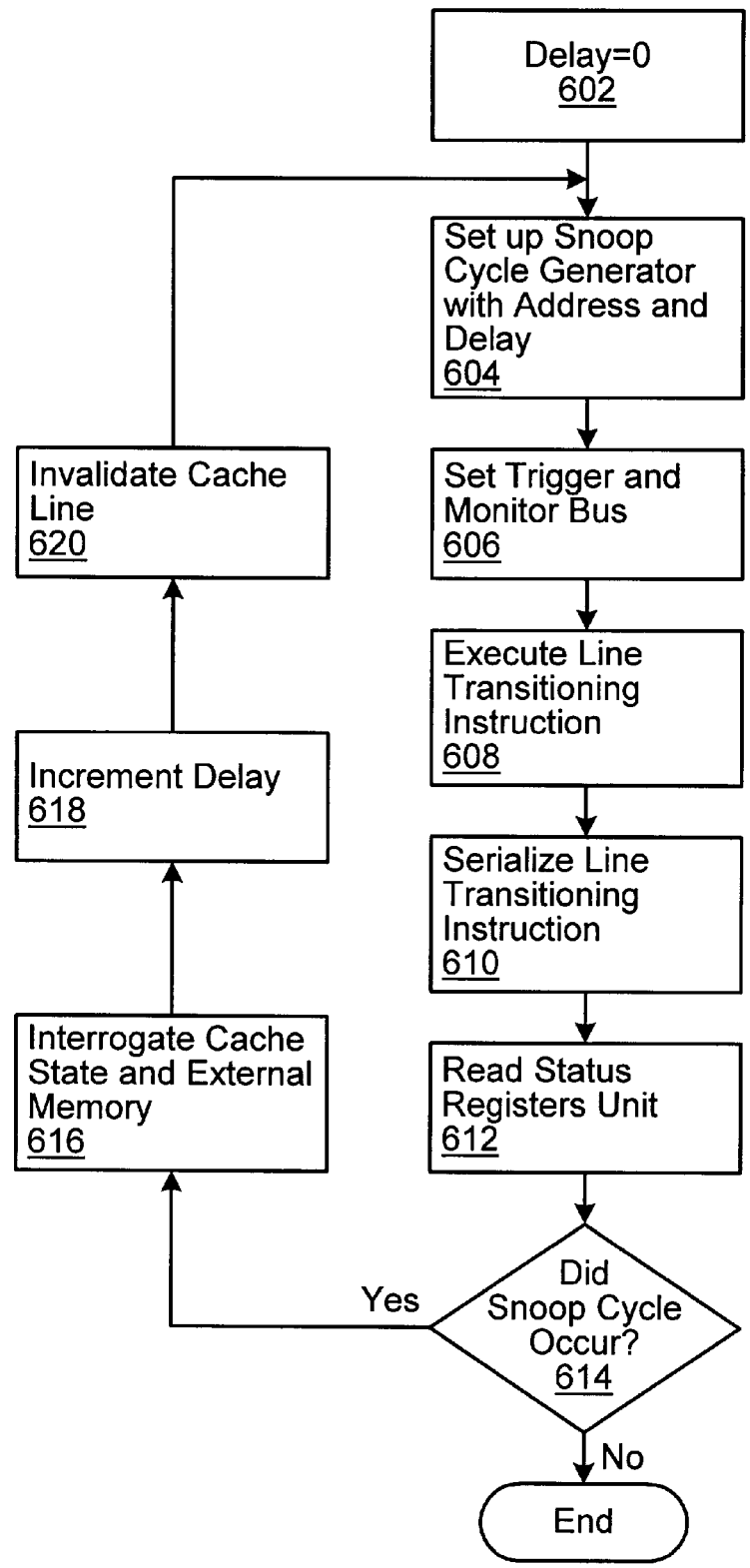
FIG. 5 is a flow diagram illustrating one embodiment of a methodology for testing a cache memory subsystem in the presence of external snoops.

FIG. 5 is a flow diagram illustrating one embodiment of a methodology for testing cache memory subsystem 302 in the presence of external snoops as implemented by the system of FIG. 4. In the following discussion, it is noted that the test methodology of FIG. 5 may in part be effectuated through execution of appropriate software code executed by processor core 304. It is further noted that test unit 502 is programmable through the execution of designated I/O cycles which correspond to the predefined address space to which the various registers within configuration registers unit 510 are mapped. Additionally, status information may be read from various registers within the status registers of unit 512 through the execution of designated I/O cycles, as will be described further below.

Referring to FIG. 5 in conjunction with FIG. 4, the test methodology is initiated by a test routine executed by processor core 304. Initially, a delay parameter associated with the program is set to zero during step 602. Subsequently, processor core 304 executes instructions during step 604 to program test unit 502 such that it will initiate a snoop cycle upon local bus 306 a predetermined time after it is triggered, as discussed further below. In one implementation, the programming of test unit 502 is accomplished by executing multiple I/O write cycles to a predetermined address corresponding to a designated register within configuration registers unit 510 to thereby store the delay parameter and a snoop address. Subsequent to this initial programming, the processor core 304 executes at step 606 an additional I/O cycle which triggers the test controller 504 such that snoop cycle generator 506 will initiate the snoop cycle upon local bus 306 upon the delay specified by the parameter stored within configuration registers unit 510. In one implementation, the snoop cycle is executed in the form of an inquire cycle. It is noted that, depending upon the delay parameter, this snoop cycle may not be initiated immediately.

Subsequently, the processor core 304 executes a memory operation which can cause a line transition within cache memory 310. Specifically, execution of such a memory operation causes address and control information to be provided by processor core 304 to buffering stage 314, and in a subsequent clock cycle to buffering stage 315. As explained previously, at some point, data corresponding to the memory operation is conveyed from system memory 308 and is stored in successive clock cycle to stages 316 and 317. Depending upon the delay parameter, the snoop cycle initiated by snoop cycle generator 506 may occur at any point in this pipelined operation. Since initially the delay is set to zero, it can be assumed that the snoop operation during this first iteration of the test operation will occur before the memory operation is presented to the cache memory subsystem from processor core 304 (i.e., before the memory operation enters the pipeline stages of the cache memory subsystem 302).

During step 606, upon triggering of the test unit 502, test monitor 508 further monitors local bus 306 to detect the assertion of certain signals including signals indicative of an occurrence of a snoop cycle (e.g., EADS). When bus monitor 508 detects an occurrence of a snoop cycle, a bit (or a set of bits indicating signal assertions corresponding to a snoop cycle) in a designated register of status registers unit 512 is updated or set to indicate the occurrence. Upon execution of the line transitioning instruction during step 608 and serialization (or completion) of the line transitioning instruction during step 610, the status registers unit 512 is read by processor core 304 to determine whether the inquire cycle has yet been initiated by snoop cycle generator 506. If the snoop cycle is indicated by status registers unit 512 as having occurred (step 614), the state of the line of cache memory 310 may be interrogated during step 616. Additionally, the state of the corresponding memory location of system memory 308 may be read without perturbing the state of the line of the cache memory subsystem 302, as will be described further below.

During step 618, the delay parameter maintained by the routine is incremented. Additionally, upon step 620, the line in the cache memory corresponding to the memory operation may be invalidated. Step 604 includes the task of getting the cache line under test into the same state each time through the loop. The test is then repeated starting at step 604 to perform the test for incremented delay value.

The steps described above are repeated until the snoop cycle is not initiated before completion of the line transitioning operation. Upon each iteration of the test, it is noted that as the delay increases, the progression of the memory operation through the cache memory subsystem 302 is increased in relation to when the programmed snoop cycle is initiated by snoop cycle generator 506. Accordingly, an appropriate test may be performed for each possible progression of the memory operation as it progresses through the pipeline stages of the cache memory subsystem 302. Upon the final iteration of the test when it is determined, in accordance with the status registers unit 512, that the snoop cycle has not occurred upon completion of the line state transitioning operation, the test may be terminated. It is noted that at this point, the final state of the cache memory subsystem 302 in response to the memory operation is entered.

The following code sequence may be executed by processor core 304 to implement the methodology as described above:

| | |
|---|---|
| | Variable Delay = 0 |
| loop label | setup snoop (Variable Delay) |
| | Out [config. Register Address], Trigger Value |
| | Mov EAX, ds [addr]; state transitioning instruction |
| | IN EBX, status Register |
| | IF EADS, continue |
| | Else Exit |
| | [Interrogate cache state and external memory] |
| | invalidate cache line (ds [addr]) |
| | Increment Variable Delay |
| Loop | loop label |

It is noted that certain operations of the exemplary code sequence are represented by their overall functionality rather than with discreet executable instructions. As indicated by the exemplary code sequence, a delay parameter is initially set to zero. A loop is then entered wherein the snoop operation to be executed by test unit 502 is first set up. As stated previously, in one implementation this operation may be accomplished by programming a given register of configuration registers unit 510 through the execution of an I/O write cycle to thereby write the address of the desired snoop operation as well as the associated delay into the register. Subsequently, an OUT instruction (i.e., another I/O operation) is executed to trigger the test unit 502, and a MOV instruction is executed (or other line state transitioning instruction) to the value residing at a memory address ds [addr] to be read into an internal register (e.g. EAX in this case) of the processor core 304. When this operation occurs, the line corresponding to the read operation address is further stored into an allocated entry of cache memory 310. The indicated "IN" instruction is subsequently executed to read an entry of status registers unit 512 which indicates whether a snoop cycle has yet occurred. It is noted that in one implementation, bus monitor 508 detects assertions of an external address strobe signal (EADS) to determine whether a snoop cycle upon local bus 306 has been executed. If the snoop cycle occurs before completion of the move instruction, the state of the cache memory subsystem 302 is then interrogated through the execution of additional instructions, as desired. Additionally, the location corresponding to the snoop address of system memory 308 may further be examined without perturbing the state of the cache line. Subsequently, the cache line is restored to its initial state and the delay parameter is incremented. The test is then repeated until the snoop operation is not detected before completion of the line transitioning operation.

As explained above, during step 616, the state of cache memory subsystem 302 may be interrogated as well as the states of various locations of system memory 308, as desired. The state of cache memory subsystem 302 may be interrogated in a number of ways. For example, appropriate instructions may be executed by processor core 304 to determine the coherency state for a particular line. In addition, during step 604, additional locations within configuration registers unit 510 of test unit 502 may be programmed to monitor additional external bus signals, such as a signal indicating whether a hit occurred and a signal indicating whether a hit to a modified line occurred (e.g., in x86 processors, these signals are referred to as HIT and HITM, respectively). During step 616, corresponding registers within status registers unit 512 may be read by processor core 304 to thereby provide an indication as to whether these signals were asserted during a particular iteration of the test.

Similarly, the state of one or more locations of system memory 308 may further be read without perturbing the state of the cache memory system 302 by programming the test unit 502 accordingly during step 604. In response to such programming, test unit 502 automatically reads the system memory 308 at a designated time and stores the value read within another location of status registers unit 512. Subsequently, at step 616, the processor 304 can read this register by executing a designated I/O cycle. It is noted that in one implementation, test unit 502 may be programmed to read the location of system memory 308 corresponding to the snoop address a predetermined time after either the HIT or HITM signals are asserted to thereby verify proper writeback functionality.

Upon completion of a test routine implementing the methodology illustrated in FIG. 5, the various results of the test may be evaluated and compared to the expected results in accordance with the coherency protocol. It is noted that the code is architecture independent.

It is noted that the test controller 504 of test unit 502 controls and orchestrates operations associated with the test unit 502, as described above. It is further noted that the specific manner in which tests are programmed and performed may vary in other embodiments. Furthermore, additional tests may also be performed. For example, in one embodiment test unit 502 is programmed to determine an order in which operations are presented to local bus 306 to thereby further evaluate the coherency functionality of the cache memory subsystem being tested.

The test system of FIG. 5 advantageously allows test and interrogation of the operation of cache memory subsystem 302 for several successive iterations of increasing delay between the time at which a memory operation is provided to the cache memory subsystem 302 from a processor core and a time at which a snoop cycle occurs. The test is automatically completed upon detecting that the snoop cycle did not occur upon completion of the memory operation. Test software for implementing the test methodology may not be required to change even if the pipeline stages routing associated with the cache memory subsystem is altered. Furthermore, excessive test operations may be avoided.

The invention described in the above detailed description is not intended to be limited to the specific form set forth herein, but on the contrary, it is intended to cover such alternatives, modifications, and equivalents, as can be reasonably included within the spirit and scope of the invention as defined.

What is claimed is:

1. A method for testing a cache memory subsystem coupled to a processor core comprising:
    (a) programming a test unit to initiate a snoop cycle on a local bus upon lapse of a predetermined delay;
    (b) executing in said processor core a memory operation to affect a designated cache line;
    (c) completing said memory operation;
    (d) determining whether said snoop cycle occurred prior to completing said memory operation;
    (e) testing to determine if coherency is preserved; and
    (f) incrementing said predetermined delay and repeating steps (a)–(e) until said snoop cycle occurs after completing said memory operation.

2. The method for testing a cache memory subsystem as recited in claim 1 further comprising monitoring said local bus for bus activity after setting said test unit.

3. The method for testing a cache memory subsystem as recited in claim 1, wherein said snoop cycle includes an address corresponding to said designated cache line.

4. The method for testing a cache memory subsystem as recited in claim 1 further comprising interrogating a state of said cache memory subsystem following completing said memory operation.

5. The method for testing a cache memory subsystem as recited in claim 4 wherein said interrogating includes reading a coherency state of said designated cache line.

6. The method for testing a cache memory subsystem as recited in claim 1 further comprising programming said test unit to read a location of a system memory having an address corresponding to said designated cache line following completing said memory operation.

7. The method for testing a cache memory subsystem as recited in claim 1 wherein said predetermined delay is set to a predetermined initial value.

8. The method for testing a cache memory subsystem as recited in claim 1 further comprising restoring said designated cache line to a predetermined initial state prior to repeating steps (a)–(e).

9. The method for testing a cache memory subsystem as recited in claim 1 further comprising monitoring said local bus to determine whether said snoop cycle is initiated upon said local bus prior to completion of said memory operation.

10. The method for testing a cache memory subsystem as recited in claim 1 further comprising monitoring said local bus to determine whether a signal indicating that a cache hit has occurred.

11. The method for testing a cache memory subsystem as recited in claim 10 further comprising monitoring said local bus to determine whether a signal indicating a hit to a modified line has occurred.

12. The method for testing a cache memory subsystem as recited in claim 1 wherein said processor core executes an instruction to read a status register of said test unit to determine whether said snoop cycle occurred prior to completing said memory operation.

\* \* \* \* \*